United States Patent
Beers et al.

(10) Patent No.: US 9,932,665 B2
(45) Date of Patent: Apr. 3, 2018

(54) CORROSION RESISTANT COATING APPLICATION METHOD

(71) Applicant: United Technologies Corporation, Hartford, CT (US)

(72) Inventors: Russell A. Beers, Manchester, CT (US); Michael N. Task, Vernon, CT (US)

(73) Assignee: United Technologies Corporation, Farmington, CT (US)

( * ) Notice: Subject to any disclaimer, the term of this patent is extended or adjusted under 35 U.S.C. 154(b) by 0 days.

(21) Appl. No.: 14/603,233

(22) Filed: Jan. 22, 2015

(65) Prior Publication Data

US 2016/0215378 A1 Jul. 28, 2016

(51) Int. Cl.

| C23C 16/10 | (2006.01) |
| C23C 14/22 | (2006.01) |
| C23C 10/04 | (2006.01) |
| C23C 10/10 | (2006.01) |
| C23C 14/14 | (2006.01) |

(52) U.S. Cl.
CPC ........... *C23C 14/221* (2013.01); *C23C 10/04* (2013.01); *C23C 10/10* (2013.01); *C23C 14/14* (2013.01)

(58) Field of Classification Search
CPC ......... C23C 16/10; C23C 16/08; C23C 16/06; C23C 16/14
See application file for complete search history.

(56) References Cited

U.S. PATENT DOCUMENTS

| 6,273,678 B1 | 8/2001 | Darolia |
| 6,497,920 B1 * | 12/2002 | Pfaendtner ............. C23C 10/20 |
| | | 427/229 |
| 6,616,969 B2 | 9/2003 | Pfaendtner et al. |
| 6,884,476 B2 | 4/2005 | Pfaendtner et al. |
| 6,924,038 B1 | 8/2005 | Hardy et al. |
| 7,229,701 B2 * | 6/2007 | Madhava ................ C23C 10/58 |
| | | 427/383.7 |
| 7,824,738 B2 | 11/2010 | Smith et al. |
| 2006/0093849 A1 * | 5/2006 | Farmer ................... C23C 30/00 |
| | | 428/651 |
| 2007/0116875 A1 * | 5/2007 | Cetel ....................... C23C 10/02 |
| | | 427/252 |

(Continued)

FOREIGN PATENT DOCUMENTS

| EP | 1076111 | 8/2000 |
| EP | 1079073 | 8/2000 |

(Continued)

OTHER PUBLICATIONS

Bernstein, Henry L., et al., "High Temperature Coatings for Industrial Gas Turbine Users." Proceedings of the 28th Turbomachinery Symposium, pp. 179-188. No date available.*

(Continued)

*Primary Examiner* — Bret Chen
(74) *Attorney, Agent, or Firm* — Bachman & LaPointe, PC

(57) ABSTRACT

A process for applying a chromized layer on a substrate by first applying an overlay coating to a portion of the substrate, and subsequently contacting a different portion of the substrate and the overlay with a gas containing gaseous chromium, wherein the gaseous chromium can be generated from a chromium source and an activator. The process prepares the substrate, often a jet engine airfoil, for service.

23 Claims, 2 Drawing Sheets

---

APPLY AN OVERLAY TO AT LEAST A PORTION OF THE SUBSTRATE USING AN OVERLAY PROCESS

HEAT A CHROMIUM MIXTURE AT A TEMPERATURE TO CAUSE THE CHROMIUM POWDER TO PRODUCE A CHROMIUM GAS

CONTACT AT LEAST A PORTION OF THE SUBSTRATE TO THE GASEOUS CHROMIUM MIXTURE

(56) References Cited

U.S. PATENT DOCUMENTS

| | | | |
|---|---|---|---|
| 2011/0135947 A1 | 6/2011 | Berndt et al. | |
| 2011/0293825 A1 | 12/2011 | Atwal et al. | |
| 2013/0115097 A1* | 5/2013 | Berger | B32B 15/01 416/241 R |
| 2013/0230406 A1* | 9/2013 | Wilkins | F01D 5/286 416/241 R |

FOREIGN PATENT DOCUMENTS

| | | |
|---|---|---|
| WO | 03/064718 | 8/2003 |
| WO | 2005/106064 | 11/2005 |
| WO | 2006/064131 | 6/2006 |
| WO | 2010094376 | 8/2010 |

OTHER PUBLICATIONS

Hazel, Brian, et al., "Development of Improved Bond Coat for Enhanced Turbine Durability". Superalloys 2008, Roger C. Reed et al., TMS (The Minerals, Metals & Materials Society, 2008, pp. 753-760.*

Streiff, Roland, "Protection of materials by advanced high temperature coatings". Journal de Physique IV, Colloque C9, supplement au Journal de Physique III, vol. 3, Dec. 1993, pp. 17-41.*

European search report for Application No. 15196017.6-1362 dated Apr. 29, 2016.

* cited by examiner

CORROSION RESISTANT COATING APPLICATION METHOD

BACKGROUND OF THE INVENTION

This disclosure relates to improvements in forming chromized coatings through overlay and diffusion coating processes.

Substrates that are subject to corrosion, such as gas turbine engine components, may include a coating to protect an underlying material from corrosion. Hot section components commonly found in the combustor and turbine sections of modern gas turbine engines are made of high temperature alloys selected from the group consisting of nickel-based superalloys, iron based superalloys, cobalt-based superalloys and combinations thereof. These superalloys have been developed to meet the demands of higher operating temperature while being able to survive the severe environment of the hot section of the gas turbine. In order to improve the survivability of the component at high temperatures under corrosive and oxidative conditions, protective coating systems typically are applied to the components.

Current corrosion resistant coatings generally fall into two categories, overlay and diffusion. Both exhibit compositions that are rich in chromium in order to support the formation of protective chromium oxide scales. Due to access, only diffusion type coating is available in the internal passageways of the turbine airfoils. Further, the presence of the diffusion coating on portions of the airfoil that get subsequent overlay oxidation resistant coating has been shown to be detrimental to both coatings. It can be difficult to mask areas effectively where coating is not required. Chromizing before or immediately after the bond coat deposition has been shown to compromise the performance of the coatings. The need exists for a way to use both diffusion chromizing for internal and external overlay coatings without compromising the performance of either of the coatings.

SUMMARY OF THE INVENTION

According to the disclosure, a method is provided of applying a chromized layer to an overlay-coated substrate using a diffusion process. The present disclosure allows an airfoil to be fully processed by overlay coating prior to conducting the chromium diffusion coating process without corrupting the performance of either of the layers.

A process is provided for applying a chromized layer on a substrate comprising the steps of: applying an overlay coating to a portion of the substrate, and contacting a different portion of the substrate and the overlay with a gas containing gaseous chromium wherein the gaseous chromium is generated from a chromium source and an activator so as to deposit the chromized layer on the different portion of the substrate.

In a further non-limiting embodiment of the foregoing example, the overlay comprises a metallic overlay.

In a further non-limiting embodiment of the foregoing examples, the metallic overlay coating comprises MCrAlY.

In a further non-limiting embodiment of the foregoing examples, the overlay comprises a thermal barrier coating.

In a further non-limiting embodiment of the foregoing examples, the thermal barrier coating is a ceramic thermal barrier coating.

In a further non-limiting embodiment of the foregoing examples, the ceramic thermal barrier coating contains ceramics selected from the group consisting of Lanthanum Zirconate and Gadolinium Zirconate, Yttria-stabilized zirconia and mixtures thereof.

In a further non-limiting embodiment of the foregoing examples, the thermal barrier coating is applied using a method selected from the group consisting of electron beam physical deposition, air plasma spray and combinations thereof.

In a further non-limiting embodiment of the foregoing examples, the applying step comprises applying a metallic overlay to the portion of the substrate and applying a ceramic thermal barrier coating to the metallic overlay.

In a further non-limiting embodiment of the foregoing examples, the substrate is an aircraft engine airfoil.

In a further non-limiting embodiment of the foregoing examples, the airfoil is a high pressure stage turbine airfoil.

In a further non-limiting embodiment of the foregoing examples, the substrate is made of a nickel-based superalloy.

In a further non-limiting embodiment of the foregoing examples, the gaseous chromium comprises chromium halide compounds.

In a further non-limiting embodiment of the foregoing examples, the process takes place in an enclosed space.

In a further non-limiting embodiment of the foregoing examples, the applying step takes place in a vacuum.

In a further non-limiting embodiment of the foregoing examples, temperature inside the enclosed space is between 1000° F. and 1975° F. during the applying step.

In a further non-limiting embodiment of the foregoing examples, temperature inside the enclosed space is between 1950° F. and 2000° F. during the contacting step.

In a further non-limiting embodiment of the foregoing examples, temperature inside the enclosed space is held between 12 and 16 hours during the contacting step.

In a further non-limiting embodiment of the foregoing examples, the contacting step does not negatively affect bond coat oxidation, hot corrosion resistance, thermal barrier coating spallation life, mechanical properties and thermal conductivity of the overlay.

In a further non-limiting embodiment of the foregoing examples, the chromized layer contains chromium in an amount between 17% and 40% by weight.

In a further non-limiting embodiment of the foregoing examples, the ratio of chromium to activator is 0.3:1.

In a further non-limiting embodiment of the foregoing examples, the chromium is present in an amount between 25 and 60% by weight of combined chromium source and activator.

In a further non-limiting embodiment of the foregoing examples, thickness of alpha ($\alpha$) chromium at the surface of the chromized layer does not exceed 0.0002 inches.

In a further non-limiting embodiment of the foregoing examples, the resulting thickness of the chromized layer produced by the contacting step is between 0.0006 and 0.0013 inches on the substrate.

In a further non-limiting embodiment of the foregoing examples, the substrate contains internal air passageways and wherein the contacting step deposits the chromized layer on the internal passageways.

In a further non-limiting embodiment of the foregoing examples, the chromized layer contains at least 17% by weight chromium on the internal air passageways.

In a further non-limiting embodiment of the foregoing examples, thickness of the chromized layer produced by the contacting step is between 0.0003 and 0.0013 inches on the internal passageways.

In a further non-limiting embodiment of the foregoing examples, the substrate is put into service after the contacting step.

The details of one or more embodiments are set forth in the accompanying drawings and the description below. Other features, objects, and advantages will be apparent from the description and drawings, and from the claims.

BRIEF DESCRIPTION OF THE DRAWINGS

The various features and advantages of the present disclosure will become apparent to those skilled in the art from the following detailed description. The drawings that accompany the detailed description can be briefly described as follows.

DETAILED DESCRIPTION

A process is provided for applying both an overlay and a diffusion process coating on a substrate without negatively affecting the bond coat oxidation, hot corrosion resistance, Thermal Barrier Spallation life, mechanical properties and thermal conductivity of the overlay.

Figure 1:
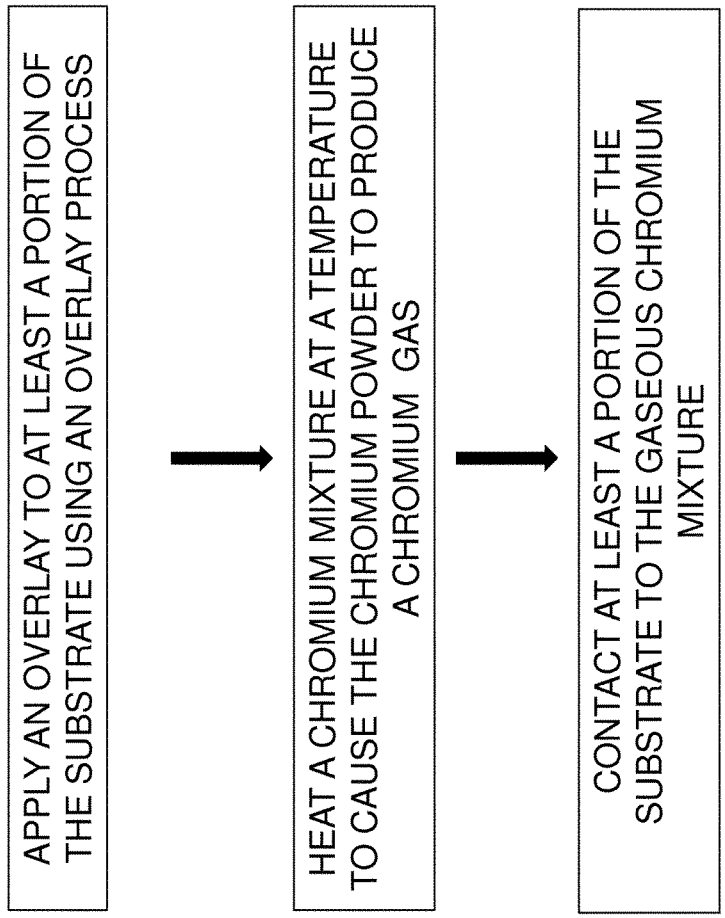
FIG. 1 illustrates an example of a method of using overlay and diffusion processes to coat a substrate.

FIG. 1 illustrates an example of a method of applying an overlay in combination with diffusion coating on a substrate with a chromized layer such as a substrate made of a nickel-based superalloy. A chromized layer is defined as a layer containing chromium. The method involves the use of an overlay process that includes a metallic layer, a ceramic thermal barrier coating, and the diffusion source comprising chromium and can be tailored to provide an effective chromium diffusion onto the nickel-based superalloy of the substrate.

The overlay process comprises applying a metallic layer that includes chromium, and applying a ceramic thermal barrier coating. The metallic layer can be made of MCrAlY. The ceramic thermal barrier coating can be selected from the group consisting of Lanthanum Zirconate, Gadolinium Zirconate, Yttria-stabilized zirconia, such as $ZrO_2$-7% $Y_2O_3$ and mixtures thereof. The resulting overlay can therefore contain various combinations of Cr, Ni, Co, Al, Y, Hf, Si, Zr, $ZrO_2$-7% $Y_2O_3$, and $Gd_2Zr_2O_7$.

The source of chromium for the diffusion process consists essentially of mixture of an active coating metal of chromium and a halide activator. For example, the source of chromium may include only the listed constituents and inadvertent impurities that do not influence the properties of the source of chromium. The chromium and other metal can also come in briquette and gravel form. The chromium coating in the disclosed application provides corrosion resistance on the internal passageways and for oxidation resistance on the external surfaces. Within the broad scope of the disclosure, the process can be used to sequentially apply overlay and diffusion coating for other purposes.

In a further example, the gaseous chromium for the contacting step contains, again relative to the total combined weight of the chromium source and activator mixture, also has 25-60% by weight of chromium. In one further example, the chromium, relative to the total combined weight, is present in an amount of 50% or less by weight.

The amounts of the activator and the chromium are selected in correspondence, for effective diffusion and area control. The relationship between the amounts of the chromium and the activator can be represented as a ratio.

For instance, the source of chromium, relative to the total combined weight of the mixture, includes between 25 and 60% by weight of the chromium and 75% and 40% by weight of the activator in a ratio of chromium to activator that is preferably 0.3:1. Providing the chromium and the activator in the ratios described helps ensure to effective diffusion of the chromium into the substrate and control over the area of the substrate into which the chromium diffuses.

A variation of the method can include heating and application steps. As an example, the heating is conducted in an enclosure having a continual flow of a carrying gas to produce an environment, in which the carrying gas is the most abundant gas, at a temperature no greater than 2000° F. The source of the chromium can be heated with the activator until gaseous chromium halides are formed, and can be mixed with carrying gas. In an exemplary embodiment of the carrying gas can be an inert gas, such as Argon.

The diffusion step includes contacting the gaseous source of chromium to the substrate, by introducing the substrate with the overlay already applied into a chamber or enclosed space filled with the gaseous mixture or by heating a solid form of the source of chromium until a desired temperature and gaseous state can be reached and then subsequently feeding the vapor directionally onto the substrate. In another embodiment of the application the substrate can also be heated prior to coating in order to enhance the reception qualities of the substrate to the chromium.

The substrate can be placed in contact with the gas for a selected amount of time, depending upon a desired thickness of the chromized layer. In some examples, the selected amount of time is between 4 and 20 hours, but preferably between 16 and 20, and the final chromium diffusion layer includes at least 20% by weight of chromium and a maximum of 3% by weight of iron. In a preferred embodiment of the method, the resulting thickness of the layer produced by diffusion is between 0.0006 and 0.0013 inches. The temperature at which the overlay is applied can be between 1000° F. and 1975° F. and is to be applied based on desired thickness.

Figure 2:
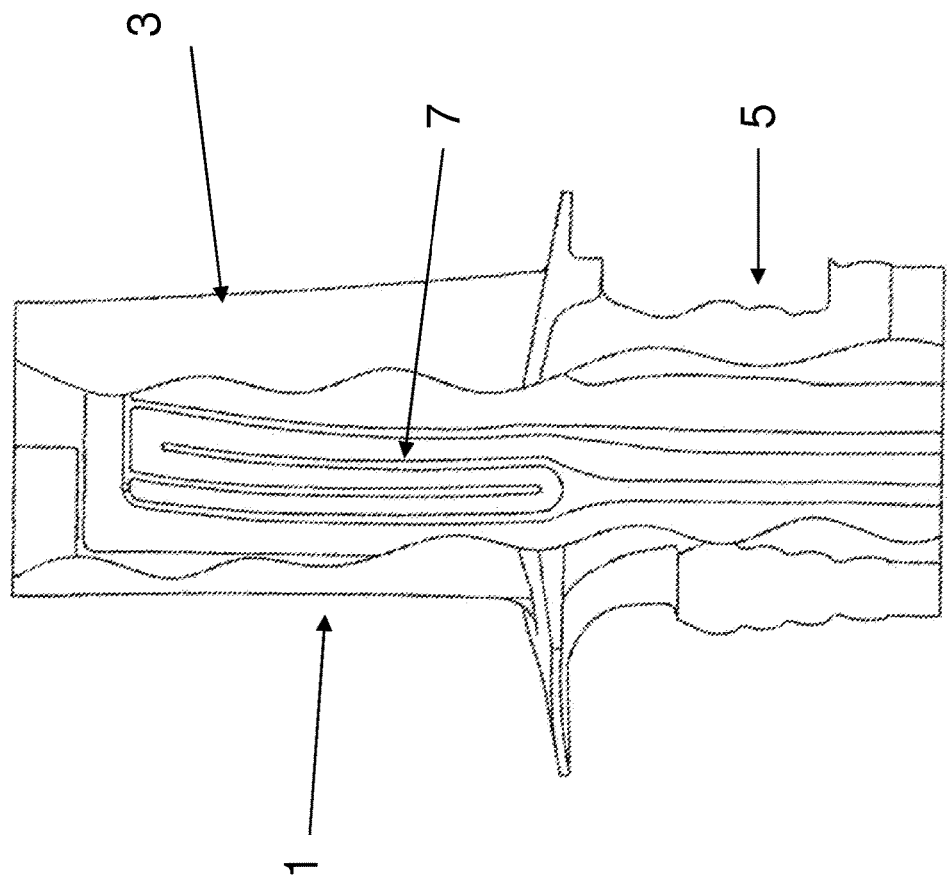
FIG. 2 shows an example of a substrate that is prepared for coating.

FIG. 2 shows a substrate (1), which in this example is a gas turbine engine turbine blade. It is to be understood, however, that the present method can also beneficially be applied to other substrates or other gas turbine engine components. In this example, the substrate generally includes an airfoil portion (3) and a root portion (5). The airfoil also generally includes internal air passage ways (7). In one embodiment of the method the internal passageways also receive a chromized surface layer. In a further embodiment of the method, the resulting thickness of the layer produced by diffusion in the internal passageways (7) is between 0.0003 and 0.0013 inches. The final chromium diffusion layer, the resulting thickness of the layer produced by diffusion in the internal passageways is at least 17% by weight of chromium and a maximum of 3% by weight of iron.

Although a combination of features is shown in the illustrated examples, not all of them need to be combined to realize the benefits of various embodiments of this disclosure.

In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The present disclosure provides a novel and non-obvious method for one or more embodiments of the present disclosure have been described. Variations and modifications to the disclosed examples may become apparent to those skilled in the art that do not necessarily depart from the essence of this disclosure. For example, the exact ratios, enclosure conditions and the initial state of chromium. Accordingly, other embodiments are within the scope of the following claims.

The invention claimed is:

1. A process for applying a chromized layer on a substrate comprising the steps of: applying an overlay coating to a portion of the substrate, and contacting a different portion of the substrate and the overlay with a gas containing gaseous chromium wherein the gaseous chromium is generated from a chromium source and an activator so as to deposit the chromized layer on the different portion of the substrate, wherein the overlay is a ceramic thermal barrier coating.

2. A process according to claim 1, wherein the ceramic thermal barrier coating contains ceramics selected from the group consisting of Lanthanum Zirconate and Gadolinium Zirconate, Yttria-stabilized zirconia and mixtures thereof.

3. A process according to claim 1, wherein the thermal barrier coating is applied using a method selected from the group consisting of: electron beam physical deposition, air plasma spray and combinations thereof.

4. A process according to claim 1, wherein the applying step comprises applying a metallic overlay to the portion of the substrate and applying the ceramic thermal barrier coating to the metallic overlay.

5. A process according to claim 1, wherein the substrate is an aircraft engine airfoil.

6. A process according to claim 5, wherein the airfoil is a high pressure stage turbine airfoil.

7. A process according to claim 1, wherein the substrate is made of a nickel-based superalloy.

8. A process according to claim 1, wherein the gaseous chromium comprises chromium halide compounds.

9. A process according to claim 1, wherein the process takes place in an enclosed space.

10. A process according to claim 1, wherein the applying step takes place in a vacuum.

11. A process according to claim 10, wherein temperature inside the enclosed space is between 1000° F. and 1975° F. during the applying step.

12. A process according to claim 10, wherein temperature inside the enclosed space is between 1950° F. and 2000° F. during the contacting step.

13. A process according to claim 12, wherein temperature inside the enclosed space is held between 12 and 16 hours during the contacting step.

14. A process according to claim 1, wherein the contacting step does not negatively affect bond coat oxidation, hot corrosion resistance, thermal bond coating spallation life, mechanical properties and thermal conductivity of the overlay.

15. A process according to claim 1, wherein the chromized layer contains chromium in an amount between 17% and 40% by weight.

16. A process according to claim 1, wherein the ratio of chromium to activator is 0.3:1.

17. A process according to claim 1, wherein the chromium is present in an amount between 25 and 60% by weight of combined chromium source and activator.

18. A process according to claim 1, wherein thickness of alpha ($\alpha$) chromium at the surface of the chromized layer does not exceed 0.0002 inches.

19. A process according to claim 1, wherein the resulting thickness of the chromized layer produced by the contacting step is between 0.0006 and 0.0013 inches on the substrate.

20. A process according to claim 1, wherein the substrate contains internal air passageways and wherein the contacting step deposits the chromized layer on the internal passageways.

21. A process according to claim 20, wherein the chromized layer contains at least 17% by weight chromium on the internal air passageways.

22. A process according to claim 21, wherein thickness of the chromized layer produced by the contacting step is between 0.0003 and 0.0013 inches on the internal passageways.

23. A process according to claim 1, wherein the substrate is put into service after the contacting step.

* * * * *